(12) United States Patent
Chae et al.

(10) Patent No.: US 12,550,689 B2
(45) Date of Patent: Feb. 10, 2026

(54) ALUMINUM NITRIDE SINTERED BODY AND MEMBER FOR SEMICONDUCTOR MANUFACTURING APPARATUS COMPRISING SAME

(71) Applicant: MiCo Ceramics Ltd., Anseong (KR)

(72) Inventors: Je Ho Chae, Pyeongtaek (KR); Hyo Sung Park, Anseong (KR); Duck Won Ahn, Yesan-gun (KR); Tae Hee Kang, Goyang (KR)

(73) Assignee: MiCo Ceramics Ltd., Anseong (KR)

( * ) Notice: Subject to any disclaimer, the term of this patent is extended or adjusted under 35 U.S.C. 154(b) by 649 days.

(21) Appl. No.: 17/938,134

(22) Filed: Oct. 5, 2022

(65) Prior Publication Data

US 2023/0024625 A1 Jan. 26, 2023

Related U.S. Application Data

(63) Continuation of application No. 16/614,731, filed as application No. PCT/KR2018/005369 on May 10, 2018, now Pat. No. 11,508,586.

(30) Foreign Application Priority Data

Jun. 30, 2017 (KR) ........................ 10-2017-0083064

(51) Int. Cl.
*C04B 35/581* (2006.01)
*C04B 35/64* (2006.01)
(Continued)

(52) U.S. Cl.
CPC .......... *H01L 21/324* (2013.01); *C04B 35/581* (2013.01); *C04B 35/64* (2013.01);
(Continued)

(58) Field of Classification Search
CPC ............ H01L 21/324; H01L 21/67098; H01L 21/67103; C04B 35/581; C04B 35/64;
(Continued)

(56) References Cited

U.S. PATENT DOCUMENTS 5,589,429 A 12/1996 Kawaguchi et al.
6,063,203 A 5/2000 Satoh
(Continued)

FOREIGN PATENT DOCUMENTS

CN 1407956 A 4/2003
CN 1414929 A 4/2003
(Continued)

OTHER PUBLICATIONS

Jin-Wook Lee et al., "Electrical Behavior of Aluminum Nitride Ceramics Sintered with Yttrium Oxide and Titanium Oxide," Journal of the Korean Ceramic Society, 2016, vol. 53, No. 6, pp. 635-640.
(Continued)

*Primary Examiner* — Mary A Wilczewski

(57) ABSTRACT

An aluminum nitride sintered body contains 1 to 5% by weight of yttrium oxide ($Y_2O_3$), 10 to 100 ppm by weight of titanium (Ti), and the balance being aluminum nitride (AlN). Accordingly, a volume resistance value and thermal conductivity at a high temperature are improved, and the generation of impurities during a semiconductor manufacturing process can be suppressed.

6 Claims, 1 Drawing Sheet

(51) Int. Cl.
*C04B 35/645* (2006.01)
*H01L 21/02* (2006.01)
*H01L 21/324* (2006.01)
*H01L 21/67* (2006.01)
*H01L 21/687* (2006.01)

(52) U.S. Cl.
CPC ........ *H01L 21/02* (2013.01); *H01L 21/02172* (2013.01); *H01L 21/67103* (2013.01); *H01L 21/68757* (2013.01); *C04B 35/645* (2013.01); *C04B 2235/3225* (2013.01); *C04B 2235/3232* (2013.01); *C04B 2235/3865* (2013.01); *C04B 2235/404* (2013.01); *C04B 2235/5436* (2013.01); *C04B 2235/72* (2013.01); *C04B 2235/9607* (2013.01)

(58) Field of Classification Search
CPC .......... C04B 35/645; C04B 2235/3225; C04B 2235/3232; C04B 2235/3865; H05B 3/143
See application file for complete search history.

(56) References Cited

U.S. PATENT DOCUMENTS

| | | | |
|---|---|---|---|
| 6,486,085 | B1 | 11/2002 | Katsuda et al. |
| 11,508,586 | B2 * | 11/2022 | Chae ........................ H01L 21/02 |
| 2006/0217259 | A1 | 9/2006 | Teratani et al. |
| 2006/0240972 | A1 | 10/2006 | Lee et al. |

FOREIGN PATENT DOCUMENTS

| | | | | |
|---|---|---|---|---|
| CN | 104725050 | A | 6/2015 | |
| JP | H02124772 | | 5/1990 | |
| JP | H06144933 | A | 5/1994 | |
| JP | H07187788 | | 7/1995 | |
| JP | H10-340896 | A | 12/1998 | |
| JP | 2001114563 | A | 4/2001 | |
| JP | 2001-163672 | A | 6/2001 | |
| JP | 3272791 | | 4/2002 | |
| JP | 2002-145670 | A | 5/2002 | |
| JP | 2002-249379 | A | 9/2002 | |
| JP | 2003-179043 | A | 6/2003 | |
| JP | 2003288975 | A | 10/2003 | |
| JP | 2003292377 | A | 10/2003 | |
| JP | 2004-182585 | A | 7/2004 | |
| JP | 2007-321138 | A | 12/2007 | |
| JP | 2008044846 | A | 2/2008 | |
| JP | 2008-127276 | A | 6/2008 | |
| JP | 2013089850 | | 5/2013 | |
| JP | 2017-085087 | A | 5/2017 | |
| KR | 920003226 | | 4/1992 | |
| KR | 20060111280 | A | 10/2006 | |
| KR | 20070071310 | A | 7/2007 | |
| KR | 100940019 | | 2/2010 | |
| KR | 100940456 | | 2/2010 | |
| KR | 10-2013-0121032 | * | 11/2013 | ............. C04B 35/64 |
| KR | 10-2022-0062698 | * | 5/2022 | ........... C04B 35/581 |
| TW | 200640827 | A | 12/2006 | |
| WO | WO2001-013423 | A | 2/2001 | |
| WO | WO2001-047831 | A1 | 7/2001 | |

OTHER PUBLICATIONS

The Office Action for Chinese Patent Application No. 202211132218.3, dated Oct. 12, 2023.

"Fundamentals of Inorganic Materials Science," Wuhan Polytechnic University Press, pp. 353-354, Aug. 2011.

* cited by examiner

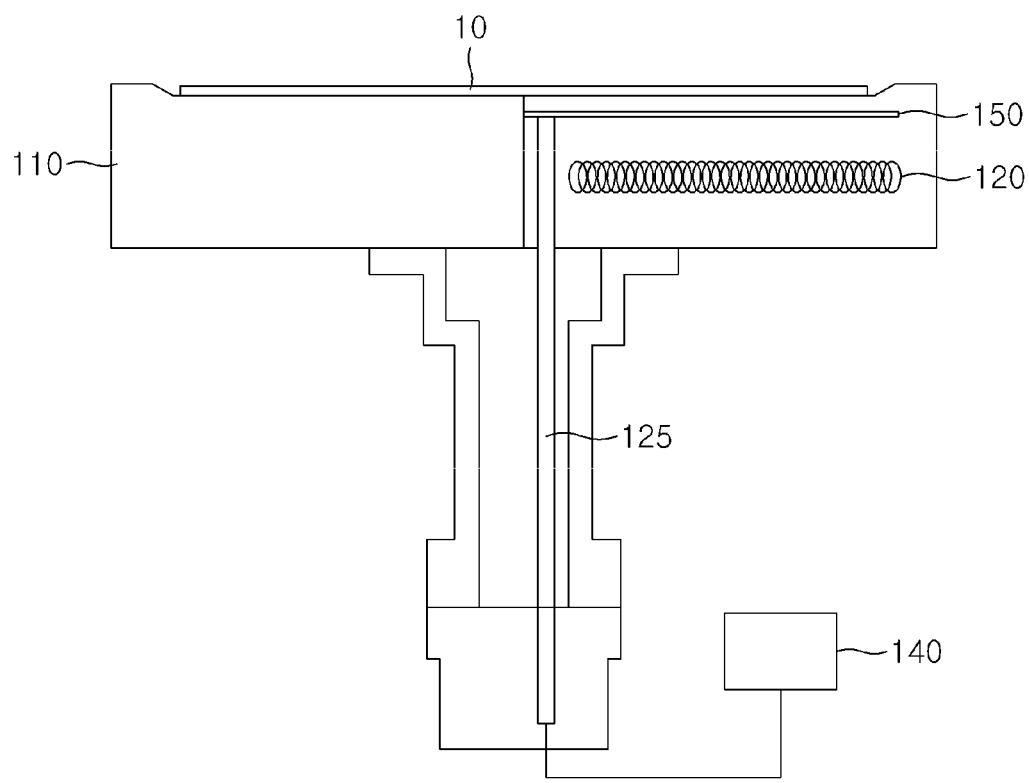

ALUMINUM NITRIDE SINTERED BODY AND MEMBER FOR SEMICONDUCTOR MANUFACTURING APPARATUS COMPRISING SAME

CROSS-REFERENCE TO RELATED APPLICATIONS

This application is a continuation of U.S. application Ser. No. 16/614,731 filed Nov. 18, 2019, which is a national stage application, filed under 35 U.S.C. § 371, of International Patent Application No. PCT/KR2018/005369, filed on May 10, 2018, which claims the priority of Korean application No. 10-2017-0083064 filed Jun. 30, 2017, the contents of which are incorporated by reference.

TECHNICAL FIELD

The present disclosure relates to an aluminum nitride sintered body and a member, comprising the same, for a semiconductor manufacturing apparatus.

BACKGROUND ART

Of members for semiconductor manufacturing apparatuses, an electrostatic chuck for holding a wafer during semiconductor processing and a semiconductor manufacturing heater for simultaneously holding and heating a wafer in chemical vaporization deposition process employ a ceramic material.

Particularly, aluminum nitride-containing ceramic materials can be applied to ceramic heaters for heating a substrate thanks to the high thermal conductivity thereof. A ceramic heater comprises a ceramic body, a reference potential layer for producing plasma inside the body, and a heating element for generating heat. Hence, an aluminum nitride-containing ceramic material requires excellent electrical insulation and thermal conductivity.

Furthermore, the ceramic heater is required to function as an electrostatic chuck utilizing an electrostatic force and thus to have a high volume resistivity value at high temperatures. For example, a ceramic material used as a constituent of the ceramic heater requires a volume resistivity of $1.0 \times 10^7$ $\Omega \cdot cm$ or higher at 500° C.

However, ceramic materials such as aluminum nitrides decrease in volume resistivity with the increase of temperatures. For a ceramic heater using a ceramic material such as aluminum nitride, the volume resistivity of the ceramic body decreases with the increase of temperatures, which may cause the generation of a leak current between the reference potential layer and the heating layer. Moreover, the ceramic heater may poorly function as an electrostatic chuck.

In order to maintain the volume resistivity value of the ceramic material at high temperatures, a metallic additive such as titanium, magnesium, or silicon, is added to the aluminum nitride accounting for the ceramic body. However, the additives lower the thermal conductivity of the ceramic heater, degrading the temperature uniformity across the ceramic heater. Furthermore, when a ceramic heater composed of an aluminum nitride containing the additive is applied to a semiconductor manufacturing apparatus, the additive may act as a pollution source during the operation of the semiconductor manufacturing apparatus.

DETAILED DESCRIPTION OF THE INVENTION

Technical Problem

A purpose of the present disclosure is therefore to provide an aluminum nitride sintered body that simultaneously retains a high volume resistivity value at high temperatures and excellent thermal conductivity and can suppress the generation of impurities.

Another purpose of the present disclosure is to provide a member, comprising the aluminum nitride sintered body, for a semiconductor manufacturing apparatus.

Technical Solution

In order to accomplish the above purposes, an aspect of the present disclosure provides an aluminum nitride sintered body comprising 1 to 5% by weight of yttrium oxide ($Y_2O_3$), 10 to 100 ppm by weight of titanium (Ti), and the balance of aluminum nitride (AlN).

In one embodiment of the present disclosure, the titanium has a weight ratio of 0.0002-0.0031 to the yttrium oxide.

In one embodiment of the present disclosure, the aluminum nitride sintered body may have a volume resistivity value of $3.0 \times 10^8$ to $5.0 \times 10^9$ $\Omega \cdot cm$ at a temperature of 500° C. in an electric field of 500 V/mm.

In one embodiment of the present disclosure, the aluminum nitride sintered body may have a thermal conductivity of 100 W/mK or greater.

In one embodiment of the present disclosure, the aluminum nitride sintered body has an impurity in an amount of 30 ppb or less as measured by an impurity test.

Another aspect of the present disclosure provides a member for a semiconductor manufacturing apparatus, the member comprising: a heating plate composed of an aluminum nitride sintered body comprising 1 to 5% by weight of yttrium oxide ($Y_2O_3$), 10 to 100 ppm by weight of titanium (Ti), and the balance of aluminum nitride (AlN); a conductive member embedded in the heating plate; and a power supply unit connected to the conductive member.

In one embodiment of the present disclosure, the titanium has a weight ratio of 0.0002-0.0031 to the yttrium oxide.

In one embodiment of the present disclosure, the aluminum nitride sintered body may have a volume resistivity value of $3.0 \times 10^8$ to $5.0 \times 10^9$ $\Omega \cdot cm$ at a temperature of 500° C. in an electric field of 500 V/mm.

In one embodiment of the present disclosure, the aluminum nitride sintered body may have a thermal conductivity of 100 W/mK or greater.

In one embodiment of the present disclosure, the aluminum nitride sintered body has an impurity in an amount of 30 ppb or less as measured by an impurity test.

Advantageous Effect

The aluminum nitride sintered body according to the present disclosure comprises 1 to 5% by weight of yttrium oxide ($Y_2O_3$), 10 to 100 ppm by weight of titanium (Ti), and the balance of aluminum nitride (AlN). Therefore, the aluminum nitride sintered body containing a small amount of the titanium element and an optimized amount of yttrium oxide can retain a high volume resistivity value at high temperature while guaranteeing excellent thermal conductivity.

Furthermore, when a semiconductor manufacturing member utilizing the aluminum nitride sintered body is employed in a semiconductor manufacturing process, the limited content of titanium, which may act as a pollution source, results in reducing defectives in the manufacturing process.

BRIEF DESCRIPTION OF THE DRAWINGS

FIG. 1 is a cross-sectional view illustrating a member for a semiconductor manufacturing apparatus in accordance with an embodiment of the present disclosure.

MODE FOR CARRYING OUT THE INVENTION

Hereinafter, an aluminum nitride sintered body according to an embodiment of the present disclosure and a member for a semiconductor manufacturing apparatus including the same will be described in detail with reference to the accompanying drawing. The present disclosure may be applied to various modifications and may have various forms, and specific embodiments are illustrated in the drawing and described in detail in the text. It should be understood, however, that the disclosure is not intended to be limited to the particular forms disclosed, but includes all modifications, equivalents, and alternatives falling within the spirit and scope of the disclosure. In the accompanying drawing, the dimensions of the structure are enlarged to illustrate the present disclosure in order to clarify the present disclosure.

The terms "first", "second", and the like may be used to describe various components, but the components should not be limited by the terms. The terms are used only for the purpose of distinguishing one component from another. For example, without departing from the scope of the present disclosure, the first component may be referred to as a second component, and similarly, the second component may also be referred to as a first component.

The terminology used in this application is used only to describe a specific embodiment and is not intended to limit the disclosure. The singular expressions include plural expressions unless the context clearly dictates otherwise. In this application, the terms "comprises", "having", and the like are used to specify that a feature, a number, a step, an operation, an element, a part or a combination thereof is described in the specification, but do not preclude the presence or addition of one or more other features, integers, steps, operations, components, parts, or combinations thereof.

Unless defined otherwise, all terms used herein, including technical or scientific terms, have the same meaning as commonly understood by one of ordinary skill in the art to which this disclosure belongs. Terms such as those defined in commonly used dictionaries are to be interpreted as having a meaning consistent with the contextual meaning of the related art and are to be interpreted as either ideal or overly formal in the sense of the present application do not.

Aluminum Nitride Sintered Body

An aluminum nitride sintered body according to the present disclosure comprises yttrium oxide, titanium, and aluminum nitride.

Aluminum nitride (AlN), which is included in the sintered body of the present disclosure, is high in thermal conductivity and electrical insulation. Therefore, the aluminum nitride (AlN) acts to allow the aluminum nitride sintered body to exhibit high thermal conductivity and high insulation.

As a result, the aluminum nitride sintered body comprising aluminum nitride can be applied to an electrostatic chuck-type heating plate that simultaneously holds and heats a wafer.

According to an embodiment of the present disclosure, the aluminum nitride may be in the form of a reductive powder with high purity (99% or higher).

The aluminum nitride sintered body of the present disclosure comprises yttrium oxide ($Y_2O_3$). Percentages by weight of yttrium oxide in the aluminum nitride sintered body are determined on the basis of the quantity of the detected elements as measured by scanning electron microscopy or transmission electron microscopy using an energy dispersive X-ray spectroscope. Percentages by weight of yttrium oxide can be calculated by converting a detected content of yttrium into a content of the oxide thereof.

The yttrium oxide allows the aluminum nitride sintered body to have thermal conductivity at a certain level or higher. That is, yttrium oxide functions to compensate for the thermal conductivity reduction caused by titanium addition.

Meanwhile, the yttrium oxide serves to help the sintering between individual ingredients during the fabrication of the aluminum nitride sintered body. For example, when added in an oxide form, yttrium reacts with the oxygen and aluminum contained in the powder for the aluminum nitride sintered body to form an aluminate compound. The aluminate compound has a relatively low sintering temperature. Consequently, the yttrium oxide makes the sintering easy through reaction with other elements for fabrication of a sintered body, acting to lower the sintering temperature during a sintering process. Thus, when used, the yttrium oxide can facilitate the sintering process for the aluminum nitride sintered body of the present disclosure and can densify the sintered body.

The yttrium oxide may be contained in an amount of 1 to 5% by weight, based on the total weight of the aluminum nitride sintered body.

Less than the suitable amount of yttrium oxide degrades the thermal conductivity of the aluminum nitride sintered body, making it difficult to use the aluminum nitride sintered body as a heater.

On the other hand, when the yttrium oxide is added in an amount exceeding the suitable range, the aluminum nitride sintered body may decrease in mechanical strength. Even an excess of yttrium oxide cannot make a particular contribution to the volume resistivity of the aluminum nitride sintered body. In this case, moreover, there may be the problem that the aluminum nitride sintered body depreciates in appearance such as color brightness or saturation.

The aluminum nitride sintered body of the present disclosure comprises titanium (Ti). The titanium (Ti) may be contained in an amount of 10 to 100 ppm by weight, based on the total weight of the aluminum nitride sintered body.

The titanium plays a role in increasing the volume resistivity value of the aluminum nitride sintered body. When the aluminum nitride is formed, together with yttrium oxide and titanium, into a sintered body, the sintered body may range in volume resistivity from $3.0 \times 10^8$ to $5.0 \times 10^9$ Ω·cm at 500° C. in the electric field of 500 V/mm. Even when increasing in temperature, a ceramic heater having the aluminum nitride sintered body applied thereto maintains a certain range of volume resistivity so that the leak current which might be generated can be suppressed.

When a content of titanium in the sintered body exceeds 100 ppm by weight (0.01% by weight), the aluminum nitride may discolor and the aluminum nitride sintered body may degrade in physical properties such as hardness and thermal conductivity. Particularly, even an excess of titanium contributes only slightly to increasing the volume resistivity of the aluminum nitride sintered body, without departing from the volume resistivity range of $3\times10^9$ Ω·cm to $4.0\times10^9$ Ω·cm.

Rather, an excess of titanium may force the aluminum nitride sintered body at a high temperature into the state in which titanium nitride (TiN) phases do not exist independently, but are connected to each other, thus rapidly decreasing the volume resistivity value of the aluminum nitride sintered body.

Now, an explanation will be given of the impurity test. According to the impurity test, a product is rubbed for a predetermined period of time while being immersed in a liquid such as isopropyl alcohol (IAP). Then, impurities existing in the liquid are counted. Particularly, the titanium (Ti) element is an impurity in a semiconductor process and thus acts as a processing pollution source during semiconductor processes.

In this regard, if the number of impurities is determined to exceed 50 ppb as measured by the impurity test, a unit including the sintered body, when applied to a semiconductor manufacturing apparatus, may cause the semiconductor manufacturing apparatus to malfunction due to the serious pollution during process operation.

In addition, if titanium is added in an amount less than 10 ppm by weight (0.001% by weight), the excessively small amount of titanium oxide decreases the volume resistivity of the aluminum nitride sintered body to too low a value to measure.

Accordingly, the titanium (Ti) is used in an amount of 10 to 100 ppm by weight, based on the total weight of the aluminum nitride sintered body.

Fabrication Method for Aluminum Nitride Sintered Body

On the basis of the total weight of an aluminum nitride sintered body, yttrium oxide ($Y_2O_3$) powder, titanium oxide (TiO2) powder, and excess aluminum nitride (AlN) powder are mixed together to prepare a mixed powder for the aluminum nitride sintered body. In this regard, the aluminum nitride powder may be reductive aluminum nitride powder with high purity. Composition ratios of the yttrium oxide ($Y_2O_3$) powder, the titanium oxidative (TiO2) powder, and the excess aluminum nitride (AlN) can be controlled.

The powders for the aluminum nitride sintered body may be mixed in a dry or wet manner.

According to one embodiment of the present disclosure, a wet mixing method is adopted. In this regard, the solvent used may be, for example, absolute ethanol, isopropyl alcohol, etc. The powders for the aluminum nitride sintered body are mixed and subjected to slurry extraction, followed by drying with a spraying drying method to afford a mixed powder. For example, the mixture is dried at about 60 to about 100° C. in a drying chamber.

The mixed powder for the aluminum nitride sintered body powder is sieved and then baked into a molded body in a suitable form before sintering. According to one embodiment of the present disclosure, the sintering is conducted by baking the molded body at about 1,700 to about 2,000° C. for 30 min or longer. For example, the powder for the aluminum nitride sintered body powder is loaded into a graphite mold, backed at a sintering temperature of about 1,850° C. for about 3 hours under a nitrogen atmosphere in a hot pressing sintering furnace and then cooled to form an aluminum nitride sintered body.

Hereinafter, the aluminum nitride sintered body of the present disclosure will be described in more detail through various Examples and Comparative Examples.

EXAMPLE 1

Based on the total weight of a powder for an aluminum nitride sintered body, 95% of aluminum nitride powder, 1% of yttrium oxide powder, and the balance of titanium oxide powder were prepared. In this regard, the % by weight of yttrium oxide was calculated as a sum of the added weight of the yttrium oxide powder plus the weight of yttrium oxide converted from the weight of precursors in the form of yttrium-containing hydrate, chloride, and the like.

As the aluminum nitride powder, a reductive aluminum nitride powder with high purity was prepared. The reductive aluminum nitride powder was 99.9% or higher pure with exclusion of oxygen and had an average particle size of about 1.3 μm.

The yttrium oxide powder had an average particle size of about 0.8 μm with a purity of 99.9% or higher. The titanium oxide powder had an average particle size of about 1.0 μm with a purity of 99.9% or higher.

These powders were wet mixed for 20 hours using a pot made of nylon and an alumina ball in absolute ethanol as a solvent. Then, the mixture was subjected to slurry extraction, followed by drying at 80° C. in a drying chamber. The dried powder mixture was allowed to pass through an 80-mesh sieve. The sieved powder was loaded into a graphite mold with diameter Φ210 mm and backed at the sintering temperature of 1,850° C. for 3 hours under a press pressure of 15 MPa and a nitrogen gas pressure of 0.1 MPa in a hot pressing sintering furnace and then cooled.

The amounts of yttrium oxide (wt. %) and titanium (ppm) were measured as follows. Amounts of elements in the aluminum nitride sintered body finally obtained were measured by scanning electron microscopy or transmission electron microscopy using an energy dispersive X-ray spectroscope. Percentages by weight of yttrium oxide were calculated by converting a detected content of yttrium into the weight of the oxide thereof. In addition, the titanium element was quantitatively analyzed by ICP MS.

EXAMPLES 2 TO 7 AND COMPARATIVE EXAMPLES 1 TO 9

Aluminum nitride sintered bodies of Examples 2 to 7 and Comparative Examples 1 to 9 were fabricated in the same manner as in Example 1, with the exception that composition ratios of aluminum nitride, yttrium oxide, and titanium were adjusted as given in Table 1, below.

TABLE 1

| Example No. | AlN Wt. % | $Y_2O_3$ Wt. % | Ti Wt. ppm | Ti Wt. % | Weight Ratio Ti/$Y_2O_3$ |
| --- | --- | --- | --- | --- | --- |
| Example 1 | 99 | 1 | 10 | 0.0010 | 0.0010 |
| Example 2 | 99 | 1 | 31 | 0.0031 | 0.0031 |
| Example 3 | 97 | 3 | 17 | 0.0017 | 0.0006 |
| Example 4 | 97 | 3 | 83 | 0.0083 | 0.0028 |
| Example 5 | 95 | 5 | 21 | 0.0021 | 0.0004 |
| Example 6 | 95 | 5 | 100 | 0.0100 | 0.0020 |
| Example 7 | 90 | 10 | 23 | 0.0023 | 0.0002 |

TABLE 1-continued

| Example No. | AlN Wt. % | Y₂O₃ Wt. % | Ti Wt. ppm | Ti Wt. % | Weight Ratio Ti/Y₂O₃ |
|---|---|---|---|---|---|
| Comparative Example 1 | 95 | 5 | 1000 | 0.1000 | 0.0026 |
| Comparative Example 2 | 95 | 5 | 130 | 0.0130 | 0.0020 |
| Comparative Example 3 | 95 | 5 | 0 | 0 | 0 |
| Comparative Example 4 | 100 | 0 | 0 | 0 | — |
| Comparative Example 5 | 100 | 0 | 6 | 0.0006 | — |
| Comparative Example 6 | 100 | 0 | 19 | 0.0019 | — |
| Comparative Example 7 | 100 | 0 | 35 | 0.0035 | — |
| Comparative Example 8 | 95 | 5 | 9 | 0.0009 | 0.0002 |
| Comparative Example 9 | 90 | 10 | 9 | 0.0009 | 0.0001 |

Characterization of Aluminum Nitride Sintered Body

The aluminum nitride sintered bodies fabricated in Examples 1 to 7 and Comparative Examples 1 to 9 were evaluated for properties and the results are summarized in Table 2, below.

TABLE 2

| Example No. | Volume Resistivity (Ω · cm) @ 400° C. | Volume Resistivity (Ω · cm) @ 500° C. | Impurity Test (ppb) | Thermal Conductivity (W/mK) |
|---|---|---|---|---|
| Example 1 | 1.0 × 10⁹ | 3.0 × 10⁸ | 13 | 125 |
| Example 2 | 2.0 × 10⁹ | 4.0 × 10⁸ | 20 | 125 |
| Example 3 | 4.0 × 10¹¹ | 3.0 × 10⁹ | 18 | 143 |
| Example 4 | 5.0 × 10¹¹ | 4.0 × 10⁹ | 24 | 143 |
| Example 5 | 1.0 × 10¹¹ | 3.0 × 10⁹ | 16 | 174 |
| Example 6 | 5.0 × 10¹¹ | 5.0 × 10⁹ | 26 | 170 |
| Example 7 | 2.0 × 10¹¹ | 4.0 × 10⁹ | 13 | 178 |
| Comparative Example 1 | 2.0 × 10¹¹ | 4.0 × 10⁹ | 332 | 152 |
| Comparative Example 2 | 1.5 × 10⁷ | 3.0 × 10⁹ | 56 | 165 |
| Comparative Example 3 | 1.0 × 10⁷ | x | 15 | 177 |
| Comparative Example 4 | x | x | 13 | 86 |
| Comparative Example 5 | 1.0 × 10⁷ | x | 17 | 90 |
| Comparative Example 6 | 6.0 × 10⁷ | x | 16 | 84 |
| Comparative Example 7 | 7.0 × 10⁷ | x | 17 | 89 |
| Comparative Example 8 | 3.0 × 10⁷ | x | 15 | 172 |
| Comparative Example 9 | 3.0 × 10⁷ | x | 15 | 178 |

Characterization Methods

Volume resistivity: Specimens with dimensions width 50 mm×length 50 mm×thickness 1 mm were prepared from the aluminum nitride sintered bodies fabricated in Examples 1 to 7 and Comparative Examples 1 to 9. An applied voltage was set to be 500 V/mm, based on the applied electric field, using an electrode with the main electrode diameter of 26 mm and the protective electrode diameter of 38 mm. After the voltage application was maintained for 60 seconds, volume resistivity values were recorded.

Impurity test method: The sintered body specimen was immersed in a liquid such as IPA and the surface of the specimen was rubbed for 10 minutes. Then, the impurities existing in the liquid were counted.

Thermal conductivity measurement method: The surface of the specimen of the aluminum nitride sintered body was blackened, and then the diffusion coefficient was calculated by a laser flash method. Using the diffusion coefficient, the thermal conductivity was derived from Equation (1):

$$\text{Density} \times \text{Specific Heat} \times \text{Diffusion Coefficient} = \text{Thermal Conductivity (W/mK)} \quad \text{(Equation 1)}$$

As described above, the aluminum nitride sintered bodies according to Examples 1 to 7 of the present disclosure exhibited volume resistivity values of $3.0 \times 10^8$ to $5.0 \times 10^9$ Ωcm at a high temperature (500° C.), less than 50 ppb of impurities as measured by the impurity test method, and a thermal conductivity of 125 W/mK or more, and thus are identified to be suitable for use as a heater member.

When yttrium oxide is not added (Comparative Examples 4 to 7), the thermal conductivity is less than 100 W/mK, which is excessively low so that the aluminum nitride sintered bodies are unsuitable for use as a heater member.

On the other hand, in the case of Comparative Examples 3 and 4 in which titanium is not contained, the volume resistivity value at a high temperature (500° C.) was reduced to an undetectable degree, whereas an excessively large amount of titanium (Comparative Example 1) makes only a tribute contribution to the increase of the volume resistivity, but causing the problem of sharply increasing impurities, compared to Example 7.

Member for Semiconductor Manufacturing Apparatus

Referring to FIG. 1, a member for a semiconductor manufacturing apparatus according to an embodiment of the present disclosure includes a heating plate 110, a conductive member 120, and a power supply unit 140.

The heating plate 110 supports a substrate 10 by using an electrostatic force. The heating plate 110 is provided to heat the substrate. The heating plate 110 has a disk shape.

The supporting member (not shown) serves to support the heating plate 110 so that the heating plate 110 is not tilted. The support member may also be made of a stainless steel alloy, an aluminum alloy, or a copper alloy.

The heating plate 110 is composed of an aluminum nitride sintered body. The aluminum nitride sintered body includes yttrium oxide, titanium, and aluminum nitride.

The aluminum nitride sintered body of the present disclosure including aluminum nitride may be used as a heating plate 110 such as a heater for holding and heating a wafer in a semiconductor manufacturing process.

The titanium functions to increase the volume resistivity value of the aluminum nitride sintered body.

According to another embodiment of the present disclosure, a dielectric layer (not shown) may be further formed on the upper surface of the heating plate 110.

The conductive member 120 is embedded in the heating plate 110. The conductive member 120 functions as an electrostatic field generating electrode, a high frequency generating electrode, a heating element, or the like.

The conductive member 120 is made of metal. For example, the conductive member 120 may be formed of a conductive material such as tungsten (W), titanium (Ti), rhodium (Rh), niobium (Nb), iridium (Ir), rhenium (Re), tantalum (Ta), molybdenum (Mo), or a combination thereof.

A connection cable 125 electrically connected to the conductive member 120 is provided under the conductive member 120. The connection cable 125 is made of a metal having a small contact resistance with the conductive member 120 and having excellent electrical conductivity.

The connection cable 125 is connected to the power supply unit 140 for supplying power to the conductive member 120. The power supplied from the power supply unit 140 to the conductive member 120 can be variously selected. For example, a DC chucking voltage may be applied from the power supply unit 140 to the conductive member 120 to generate an electrostatic field over the plate 110. A plasma may be produced with a high-frequency bias power while a general AC voltage may be supplied to generate heat from the conductive member 120.

INDUSTRIAL APPLICABILITY

The aluminum nitride sintered bodies according to the embodiments of the present disclosure can be applied to an electrostatic chuck for holding a wafer and to a heater that acts to simultaneously hold and heat a wafer in a chemical vapor deposition (CVD) process and the like.

While the present disclosure has been particularly shown and described with reference to exemplary embodiments thereof, it will be understood by those of ordinary skill in the art that various changes in form and detail may be made therein without departing from the spirit and scope of the disclosure as defined by the appended claims. In addition, changes may be made without departing from the spirit and scope of the disclosure.

The invention claimed is:

1. A ceramic heater for a semiconductor manufacturing apparatus, the ceramic heater comprising an aluminum nitride sintered body containing titanium, yttrium, and aluminum nitride, wherein the sintered body comprises Ti in an amount of 17 to 31 ppm, based on the total weight of the sintered body, wherein the ceramic heater has a volume resistivity value of $2.0 \times 10^9$ to $5.0 \times 10^{11}$ $\Omega \cdot cm$ at a temperature of 400° C. in an electric field of 500 V/mm and the ceramic heater comprises a conductive heater member embedded in the aluminum nitride sintered body, and wherein the aluminum nitride sintered body is sintered by material powders containing yttrium oxide in an amount of 1-5 wt %.

2. The ceramic heater of claim 1, wherein the ceramic heater has a volume resistivity value of $2.0 \times 10^9$ to $4.0 \times 10^{11}$ $\Omega \cdot cm$ at a temperature of 400° C. in an electric field of 500 V/mm.

3. The ceramic heater of claim 1, wherein the ceramic heater comprises:
    a conductive heater member embedded in the aluminum nitride sintered body; and
    a power supply unit connected to the conductive member.

4. The ceramic heater of claim 1, wherein the ceramic heater has a thermal conductivity of 100 W/mK or greater.

5. The ceramic heater of claim 1, wherein the ceramic heater has an impurity in an amount of 30 ppb or less as measured by an impurity test.

6. The ceramic heater of claim 1, wherein the sintered body has a mass ratio of $Ti/Y_2O_3$ is in the range of 0.0006-0.0031.

* * * * *